US009886120B2

(12) United States Patent
Zhang et al.

(10) Patent No.: US 9,886,120 B2
(45) Date of Patent: Feb. 6, 2018

(54) GATE DRIVING CIRCUIT AND DRIVING METHOD THEREOF, AND DISPLAY APPARATUS

(71) Applicant: BOE TECHNOLOGY GROUP CO., LTD., Beijing (CN)

(72) Inventors: Yuanbo Zhang, Beijing (CN); Jiayang Zhao, Beijing (CN); Seung Woo Han, Beijing (CN); Xiangxiang Zou, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 78 days.

(21) Appl. No.: 14/436,979

(22) PCT Filed: Oct. 15, 2014

(86) PCT No.: PCT/CN2014/088681
§ 371 (c)(1),
(2) Date: Apr. 20, 2015

(87) PCT Pub. No.: WO2015/143864
PCT Pub. Date: Oct. 1, 2015

(65) Prior Publication Data
US 2016/0274713 A1    Sep. 22, 2016

(30) Foreign Application Priority Data
Mar. 27, 2014  (CN) .......................... 2014 1 0119047

(51) Int. Cl.
*G06F 3/041*    (2006.01)
*G11C 19/28*    (2006.01)
*G09G 3/36*    (2006.01)

(52) U.S. Cl.
CPC ............ *G06F 3/0416* (2013.01); *G06F 3/041* (2013.01); *G06F 3/0412* (2013.01);
(Continued)

(58) Field of Classification Search
CPC .... G06F 3/0412; G06F 3/0416; G06F 3/0418; G09G 3/3266; G09G 3/3611;
(Continued)

(56) References Cited

U.S. PATENT DOCUMENTS

2013/0241814 A1* 9/2013 Hirabayashi ......... G09G 3/3677
345/100
2014/0055411 A1* 2/2014 Zhao ....................... G06F 3/044
345/174

(Continued)

FOREIGN PATENT DOCUMENTS

CN    202720872 U    2/2013
CN    103412672 A    11/2013
(Continued)

OTHER PUBLICATIONS

Jan. 23, 2015—(PCT) International Search Report—App. No. PCT/CN2014/008681.

(Continued)

*Primary Examiner* — Keith Crawley
(74) *Attorney, Agent, or Firm* — Banner & Witcoff, Ltd.

(57) ABSTRACT

There is provided a gate driving circuit and driving method thereof, and display apparatus. The method comprises: performing gate drive scanning on shift register units located in a first region in the gate driving circuit; performing touch scanning after the gate drive scanning of the shift register units in the first region is completed; scanning again a last stage of shift register unit located in the first region before the touch scanning is completed, so that the last stage of shift register unit located in the first region pre-charges a first stage of shift register unit located in a second region; and performing gate drive scanning on shift register units located in the second region in the gate driving circuit, the last stage of shift register unit located in the first region connected in (Continued)

cascades with the first stage of shift register unit located in the second region.

19 Claims, 5 Drawing Sheets

(52) U.S. Cl.
CPC ........... *G09G 3/3677* (2013.01); *G11C 19/28* (2013.01); *G09G 2300/0426* (2013.01); *G09G 2300/0809* (2013.01); *G09G 2310/0251* (2013.01); *G09G 2310/0286* (2013.01); *G09G 2310/08* (2013.01); *G09G 2320/0219* (2013.01)

(58) Field of Classification Search
CPC ............... G09G 3/3666; G09G 3/3677; G09G 2310/0202; G09G 2310/0213; G09G 2310/0267; G09G 2310/0286; G02F 1/13338; G11C 19/00; G11C 19/18; G11C 19/182; G11C 19/184; G11C 19/188; G11C 19/28; G11C 19/285; G11C 19/287
See application file for complete search history.

(56) References Cited

U.S. PATENT DOCUMENTS

| 2014/0176459 | A1* | 6/2014 | Pyo | G06F 3/0416 345/173 |
| 2015/0091822 | A1* | 4/2015 | Dong | G06F 3/0416 345/173 |
| 2015/0268777 | A1* | 9/2015 | Okamura | G06F 3/0412 345/205 |
| 2015/0302790 | A1* | 10/2015 | Dong | G11C 19/28 345/214 |
| 2016/0103510 | A1* | 4/2016 | Liu | H03K 17/687 345/214 |

FOREIGN PATENT DOCUMENTS

| CN | 103943055 A | | 7/2014 | |
| CN | 203760057 U | * | 8/2014 | ............... G09G 3/36 |
| JP | 2008140489 A | | 6/2008 | |
| KR | 20080051637 A | | 6/2008 | |

OTHER PUBLICATIONS

Jan. 23, 2015—(PCT)—Written Opinion of the International Searching Authority—App. No. PCT/CN2014/088681.

* cited by examiner

GATE DRIVING CIRCUIT AND DRIVING METHOD THEREOF, AND DISPLAY APPARATUS

The application is a U.S. National Phase Entry of International Application No. PCT/CN2014/088681 filed on Oct. 15, 2014, designating the United States of America and claiming priority to Chinese Patent Application No. 201410119047.X filed on Mar. 27, 2014. The present application claims priority to and the benefit of the above-identified applications and the above-identified applications are incorporated by reference herein in their entirety.

TECHNICAL FIELD

The present disclosure relates to a gate driving circuit and driving method thereof, and display apparatus.

BACKGROUND

As a touch display apparatus becomes increasingly popular, people's requirement for quality of the touch display apparatus is higher and higher. Since in-cell touch technique has advantages of thin thickness and high touch sensitivity and so on, this technique has been widely applied.

The in-cell touch technique integrates touch elements inside a display panel so that the panel per se has a touch function, and thus an effect and application of touch can be achieved without additionally fitting and assembling with the touch panel. By taking a typical thin film transistor-liquid crystal display (TFT-LCD) as an example, its characteristic is the manufacturing technique of completing touch sensing elements in a TFT-LCD standard manufacturing process. Since it does not need to additionally set a touch panel, there is no problem of fitting and contraposition, so that weight and thickness are greatly reduced, and the product will be thinner. Due to the use of in-cell technique, a product of display apparatus does not need any frame so as to realize a full plane design, and the product has a simpler design and a broader application field.

The known in-cell touch technique generally adopts a projection multi-point capacitive touch mode, and the acquisition of touch signals is performed through two layers of signal lines, wherein one layer of signal lines are driving lines (Tx lines), and the other layer of signal lines are sensing lines (Rx lines). The two layers of lines are vertical to each other. In terms of implementations, a scanning mode is adopted to drive each driving line in turns and measure whether a capacitive coupling phenomenon occurs to a point of the sensing line interlaced with this driving line. Through scanning one by one, an exact touch point position can be obtained, and multi-touch can be realized.

For the known touch display apparatus, when pixels and scanning lines in the same row or column are charged simultaneously, they may interfere with each other, and thus the processes of pixel charging and scanning are always performed in a time division mode. In particular, there are generally two timing modes within a frame, i.e., V-Blank and H-Blank. The V-Blank mode means to reserve a period of time to perform touch signal scanning after all the pixels are charged within a frame, that is, pixel charging and touch scanning are performed separately. Such mode only supports a touch scanning refresh rate the same as a display picture refresh rate (1:1 relationship). If the picture refresh rate is 60 HZ, then the touch scanning refresh rate is only 60 HZ. In order to increase flexibility of the touch, the key is to increase the frequency of the touch scanning. In the pursuit of an experience effect of high-performance touch, a touch refresh rate of 120 HZ or greater is necessary.

The H-Blank mode can effectively increase the touch scanning refresh rate. This mode performs part of touch signal scanning by reserving a period of time in the interval of pixel charging in certain number of rows within a frame, that is, the pixel charging and the touch scanning are alternately performed. Such mode can support a touch scanning refresh rate being greater than the picture refresh rate, i.e., having a multiply relationship with the picture refresh rate.

SUMMARY

There provide in several embodiments of the present disclosure a gate driving circuit and driving method thereof, and display apparatus, which can avoid insufficient charging rate of pixels in rows and improve dark line or bad bright line.

According to one aspect of an embodiment of the present disclosure, there is provided a driving method of a gate driving circuit, the gate driving circuit including a plurality of shift register units mutually connected in cascades, comprising following steps:

performing a gate drive scanning on shift register units located in a first region in the gate driving circuit; performing a touch scanning after the gate drive scanning of the shift register units in the first region is completed;

scanning again a last stage of shift register unit located in the first region before the touch scanning is completed, so that the last stage of shift register unit located in the first region pre-charges a first stage of shift register unit located in a second region; and performing a gate drive scanning on shift register units located in the second region in the gate driving circuit, the last stage of shift register unit located in the first region being connected in cascades with the first stage of shift register unit located in the second region.

According to another aspect of an embodiment of the present disclosure, there is further provided a gate driving circuit comprising a plurality of shift register units mutually connected in cascades, wherein scan outputting and touch scanning of multiple stages of shift register units are performed at intervals;

except for a first stage of shift register unit, a signal output terminal of each of remaining shift register units is connected to a second signal input terminal of an adjacent previous stage of shift register unit;

except for a last stage of shift register unit, a signal output terminal of each of remaining shift register units is connected to a first signal input terminal of an adjacent next stage of shift register unit;

the last stage of shift register unit located in a first region outputs again after the touch scanning is completed, so that the last stage of shift register unit located in the first region pre-charges a first stage of shift register unit located in a second region;

wherein the last stage of shift register unit located in the first region is connected in cascades with the first stage of shift register unit located in the second region.

In addition, an embodiment of the present disclosure further provides a display apparatus comprising the gate driving circuit described above.

According to the gate driving circuit and its driving method and display apparatus in the embodiments of the present disclosure, the gate driving circuit successively scans respective stages of shift register units located in the first region and the second region, performs the touch scanning at intervals of the gate drive scanning in the two regions, and scans again the last stage of shift register unit located in the first region after the touch scanning is completed, so that the last stage of shift register unit located in the first region pre-charges the first stage of shift register unit located in the second region. In this way, it is avoided that a phenomenon of electricity leakage of a pulling-up control node PU of the first stage of shift register unit after the touch scanning is completed is caused by a relatively long touch scanning time intervened between outputs of the shift register units of two rows, thereby avoiding the defect of insufficient charging rate of pixels in rows while ensuring the touch scanning having a high report rate, greatly improving dark line or bad bright line and raising the display quality.

DETAILED DESCRIPTION

Technical solutions in some embodiments of the present disclosure will be clearly and completely described by combining with the accompanying figures.

Transistors adopted in all the embodiments of the present disclosure can be thin film transistors or field effect transistors or other devices having same characteristics. Since sources and drains of the transistors adopted herein are symmetrical, the sources and drains have no distinction. In the embodiments of the present disclosure, in order to distinguish the two electrodes of the transistors other than the gate of the same, one electrode is called as a first electrode, and the other electrode is called as a second electrode. In addition, the transistors can be divided into N type and P type according to characteristics of the transistors. The following embodiments are described by taking the N type transistors as an example. Since the P type transistor has a principle similar to the N type transistor, description is not repeated herein. When an N type transistor is adopted, the first electrode can be a source of the N type transistor while the second electrode can be a drain of the N type transistor.

Figure 1:
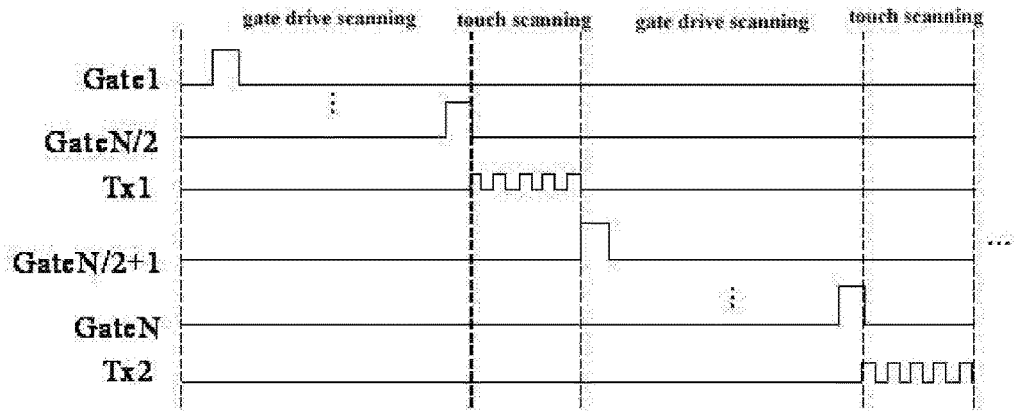
FIG. 1 is a schematic diagram of a structure of a known in-cell touch scanning timing that adopts an H-Blank mode to realize twice of display refresh frequency.

FIG. 1 shows schematically a structure of a known in-cell touch scanning timing that adopts an H-Blank mode to realize twice of the display refresh frequency. As shown in FIG. 1, the in-cell touch scanning timing that adopts an H-Blank mode to realize twice of the display refresh frequency performs one time of scanning (Tx scanning) on all the touch sensing lines by dividing the display scanning into two segments in average, and suspends the operation of the pixel scanning Gate Drive on Array (GOA) circuit after each segment ends up. Therefore, touch scanning can be completed twice within one time of display scanning, so as to realize the touch scanning that is double of the display refresh frequency.

Figure 2:
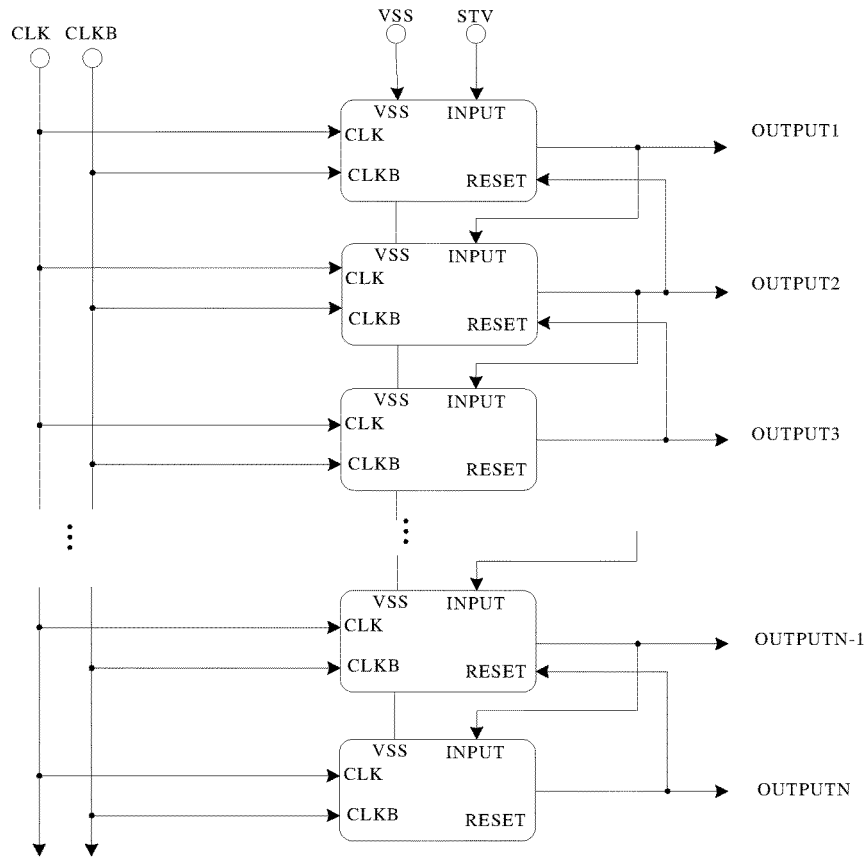
FIG. 2 is a schematic diagram of a structure of a known gate driving circuit.

FIG. 2 shows schematically a structure of a known gate driving circuit. As shown in FIG. 2, the known GOA circuit generally comprises a plurality of shift register units connected in cascades, wherein each of the shift register units is connected to a shift register unit in an adjacent row respectively and corresponds to one row of gate lines, and a shift register unit of each row will pre-charge a shift register unit of a next row while outputting a gate driving signal, so as to ensure that the shift register unit of the next row realizes output within a next clock period.

Figure 3:
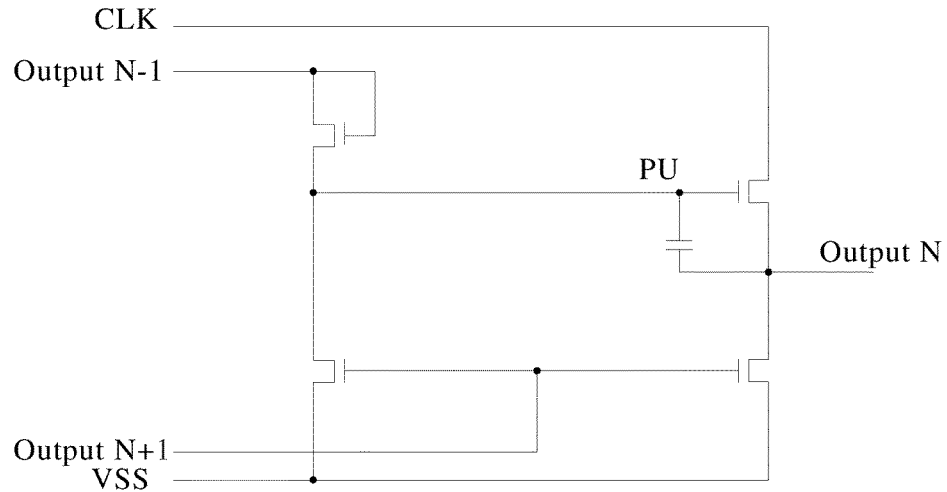
FIG. 3 is a schematic diagram of a structure of a shift register unit in a known gate driving circuit.

FIG. 3 is a schematic diagram of a structure of a known shift register unit in a gate driving circuit. As shown in FIG. 3, the known shift register unit takes the simplest 4T1C structure as an example. In the case of performing the H-Blank timing scanning as shown in FIG. 1, a shift register unit of the (N/2+1)-th row is in a row at first of the second ½ display scanning, but its pulling-up control PU node has been charged to be a high level at the time of an output of the (N/2)-th row, since a relatively long scanning time is intervened between the output of the (N/2)-th row and the (N/2+1)-th row, a level at the node PU will leak electricity through a connected TFT, thereby seriously influencing the pre-charge of the shift register unit of the (N/2+1)-th row, so that voltage decreases when the shift register unit of the (N/2+1)-th row outputs, which thus results in insufficient charging rate of pixels in this row and occurrence of dark line or bad bright line.

Figure 4:
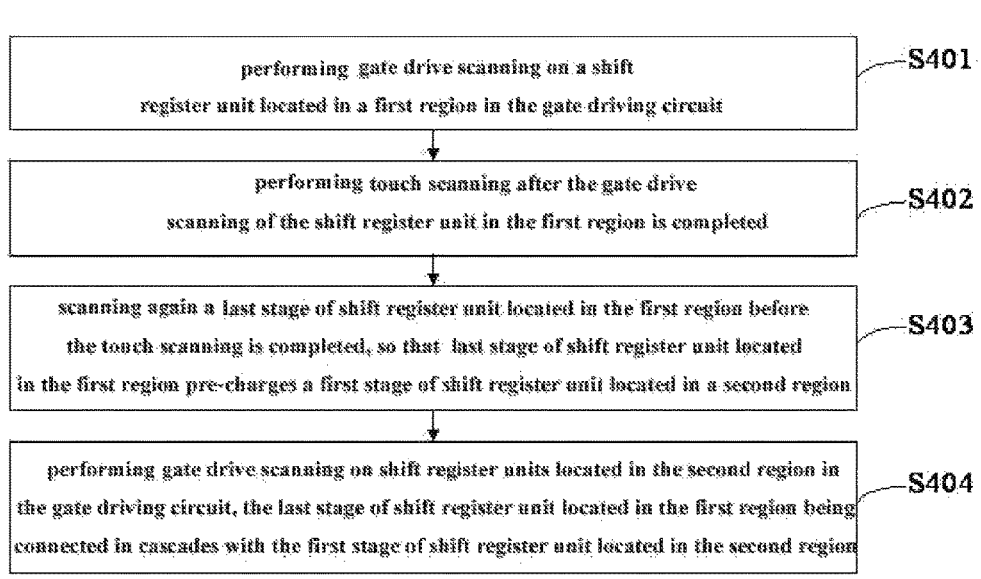
FIG. 4 is a flow diagram of a driving method of a gate driving circuit according to an embodiment of the present disclosure.

FIG. 4 shows schematically a flow diagram of a driving method of a gate driving circuit according to an embodiment of the present disclosure. In FIG. 4, the gate driving circuit comprises a plurality of shift register units mutually connected in cascades. As shown in FIG. 4, the method comprises following operating processes.

In step S401, performing a gate drive scanning on a shift register unit located in a first region in the gate driving circuit.

In step S402, performing a touch scanning after the gate drive scanning of the shift register unit in the first region is completed.

In step S403, scanning again a last stage of shift register unit located in the first region before the touch scanning is completed, so that the last stage of shift register unit located in the first region pre-charges a first stage of shift register unit located in a second region.

For example, it can be selected to scan again the last stage of shift register unit located in the first region within a frame time before the touch scanning is about to be completed. At this time, since it has not yet started to perform the gate drive scanning on the shift register unit in the second region, the touch scanning and display scanning will not be influenced and pre-charging of the first stage of shift register unit located in the second region can be realized.

In step S404, performing a gate drive scanning on shift register units located in the second region in the gate driving circuit, the last stage of shift register unit located in the first region being connected in cascades with the first stage of shift register unit located in the second region.

According to the driving method of the gate driving circuit in the embodiment of the present disclosure, the gate driving circuit successively scans the respective stages of shift register units located in the first region and the second region, and performs the touch scanning between the gate drive scanning and the gate drive scanning of the two regions. The gate driving circuit scans again the last stage of shift register unit located in the first region after the touch scanning is completed, so that the last stage of shift register unit located in the first region pre-charges a first stage of shift register unit located in a second region. In this way, it is avoided that a phenomenon of electricity leakage of the pulling-up control node PU of the first stage of shift register unit after the touch scanning is completed is caused by a relatively long touch scanning time intervened between outputs of the shift register units of two rows, thereby avoiding the defect of insufficient charging rate of pixels in rows while ensuring the touch scanning having a high report rate, greatly improving dark line or bad bright line and raising the display quality.

It is noted that in the process of performing the gate drive scanning and touch scanning on the array substrate having N rows of gate lines, in order to increase accuracy and report rate of the touch scanning, the key is to increase the frequency of the touch scanning. This requires adding multiple times of touch scanning in the process of one time of gate drive scanning. Part of touch signal scanning can be performed by reserving a period of time at the interval of pixel charging in certain number of rows, that is, the pixel charging and the touch scanning are performed alternately. Such mode can support a touch scanning refresh rate being greater than the picture refresh rate, i.e., having a multiple relationship with the picture refresh rate.

In the driving method of the gate driving circuit according to the embodiment of the present disclosure, it is described by dividing the array substrate into two regions having the same number row of gate lines in average. At this time, a region where the former N/2 rows of gate lines are located can be called as a first region, and a region where the latter N/2 rows of gate lines are located can be called as a second region. A period of time after the scanning in the first region is completed and before the scanning in the second region starts is the touch scanning time. After the touch scanning is completed, the last stage of shift register unit located in the first region is scanned again, so that the last stage of shift register unit located in the first region pre-charges the first stage of shift register unit located in the second region. Of course, the above is just an illustration. In order to further increase the refresh rate of the touch scanning, the gate lines on the array substrates can be divided into more regions to perform scanning, to which the present disclosure is not limited.

Figure 5:
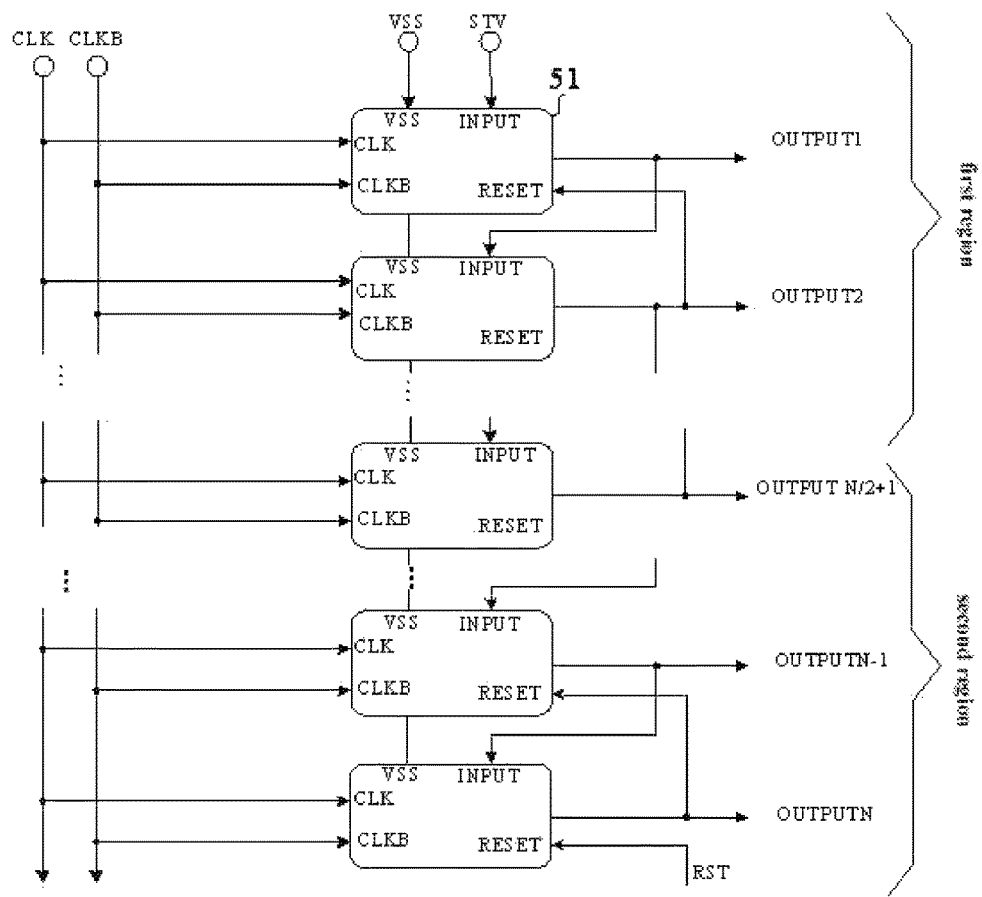
FIG. 5 is a schematic diagram of a structure of a gate driving circuit according to an embodiment of the present disclosure.

FIG. 5 schematically shows a structure of a gate driving circuit according to an embodiment of the present disclosure. As shown in FIG. 5, the gate driving circuit comprises a plurality of shift register units 51 mutually connected in cascades. Scan outputting and touch scanning of the multiple stages of shift register units 51 are performed at intervals.

In the circuit as shown in FIG. 5, except for the first stage of shift register unit, a signal output terminal OUTPUT of each of remaining shift register units 51 is connected to a second signal input terminal INPUT2 of an adjacent previous stage of shift register unit.

Except for the last stage of shift register unit, a signal output terminal OUTPUT of each of remaining shift register units 51 is connected to a first signal input terminal INPUT1 of an adjacent next stage of shift register unit.

After the touch scanning is completed, the last stage of shift register unit located in the first region outputs again, so that the last stage of shift register unit located in the first region pre-charges the first stage of shift register unit located in the second region.

Herein, the last stage of shift register unit located in the first region is connected in cascades with the first stage of shift register unit located in the second region.

The gate driving circuit according to the embodiment of the present disclosure scans successively the respective stages of shift register units located in the first region and the second region, and performs the touch scanning at intervals of the gate drive scanning in the two regions. Through scanning again the last stage of shift register unit located in the first region after the touch scanning is completed, the last stage of shift register unit located in the first region pre-charges the first stage of shift register unit located in the second region. In this way, it is avoided that a phenomenon of electricity leakage of the pulling-up control node PU of the first stage of shift register unit after the touch scanning is completed is caused by a relatively long touch scanning time intervened between outputs of the shift register units of two rows, thereby avoiding the defect of insufficient charging rate of pixels in rows while ensuring the touch scanning having a high report rate, greatly improving dark line or bad bright line and raising the display quality.

It is noted that in the process of performing the gate drive scanning and touch scanning on the array substrate having N rows of gate lines, in order to increase accuracy and report rate of the touch scanning, the key is to increase the frequency of the touch scanning. This requires adding multiple times of touch scanning in the process of one time of gate drive scanning. Part of touch signal scanning can be performed by reserving a period of time at the intervals of pixel charging in certain number of rows, that is, the pixel charging and the touch scanning are performed alternately. Such mode can support a touch scanning refresh rate being greater than the picture refresh rate, i.e., having a multiple relationship with the picture refresh rate.

For example, in the gate driving circuit as shown in FIG. 5, it is described by dividing the array substrate into two regions having the same row number of gate lines in average. At this time, a region where the former N/2 rows of gate lines are located can be called as a first region, and a region where the latter N/2 rows of gate lines are located can be called as a second region. A period of time after scanning in the first region is completed and before scanning in the second region starts is the touch scanning time. After the touch scanning is completed, the last stage of shift register unit located in the first region is again scanned, so that the last stage of shift register unit located in the first region pre-charges the first stage of shift register unit located in the second region. Of course, the above is just an illustration. In order to further increase the refresh rate of the touch scanning, the gate lines on the array substrates can be divided into more regions to perform scanning, to which the present disclosure is not limited.

Figure 6:
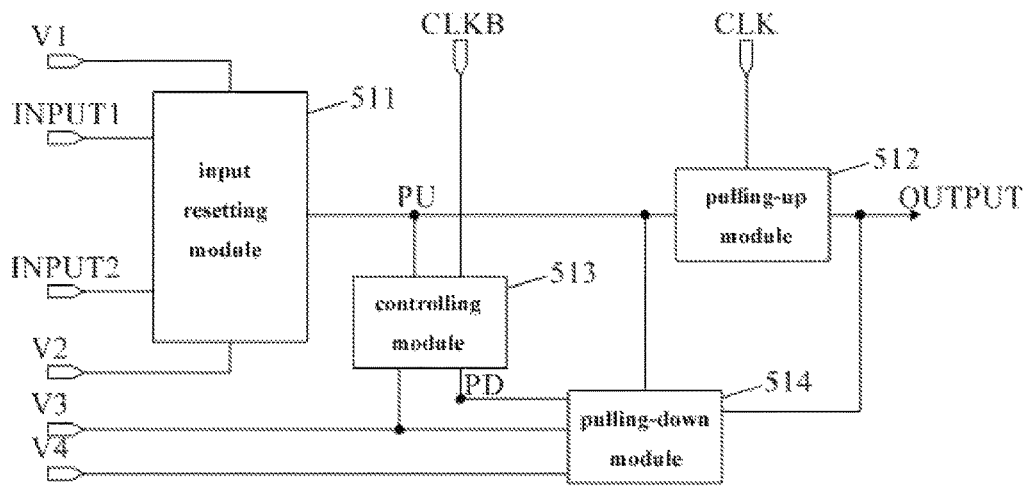
FIG. 6 is a schematic diagram of a structure of a shift register unit in a gate driving circuit in an embodiment of the present disclosure.

FIG. 6 shows schematically a structure of a shift register unit in a gate driving circuit according to an embodiment of the present disclosure. As shown in FIG. 6, the shift register unit 51 can comprise: an input resetting module 511, a pulling-up module 512, a controlling module 513, and a pulling-down module 514.

In FIG. 6, the input resetting module 511 is connected to the first signal input terminal INPUT1, the second signal input terminal INPUT2, a first voltage terminal V1, a second voltage terminal V2 and the pulling-up control node PU, and configured to control a level at the pulling-up control node PU according to signals input by the first signal input terminal INPUT1 and the second signal input terminal INPUT2. The pulling-up control node PU is a connecting point of the input resetting module 511 and the pulling-up module 512. In the case of performing the touch scanning, the second signal input terminal INPUT2 is input a high level, so as to keep the level at the pulling-up control node PU.

The pulling-up module 512 is connected to a first clock signal input terminal CLK, the pulling-up control node PU and the signal output terminal OUTPUT, and configured to pull up a signal output by the signal output terminal OUTPUT to a high level according to the level at the pulling-up control node PU and a clock signal input by the first clock signal input terminal CLK.

The controlling module 513 is connected to a second clock signal input terminal CLKB, a third voltage terminal V3, the pulling-up control node PU and a pulling-down control node PD, and configured to control a level at the pulling-down control node PD according to a clock signal input by the second clock signal input terminal CLKB and the level at the pulling-up control node.

The pulling-down module 514 is connected to the pulling-up control node PU, the pulling-down control node PD, the third voltage terminal V3, a fourth voltage terminal V4 and the signal output terminal OUTPUT, and configured to pull down the signal output by the signal output terminal OUTPUT to a low level.

Figure 7:
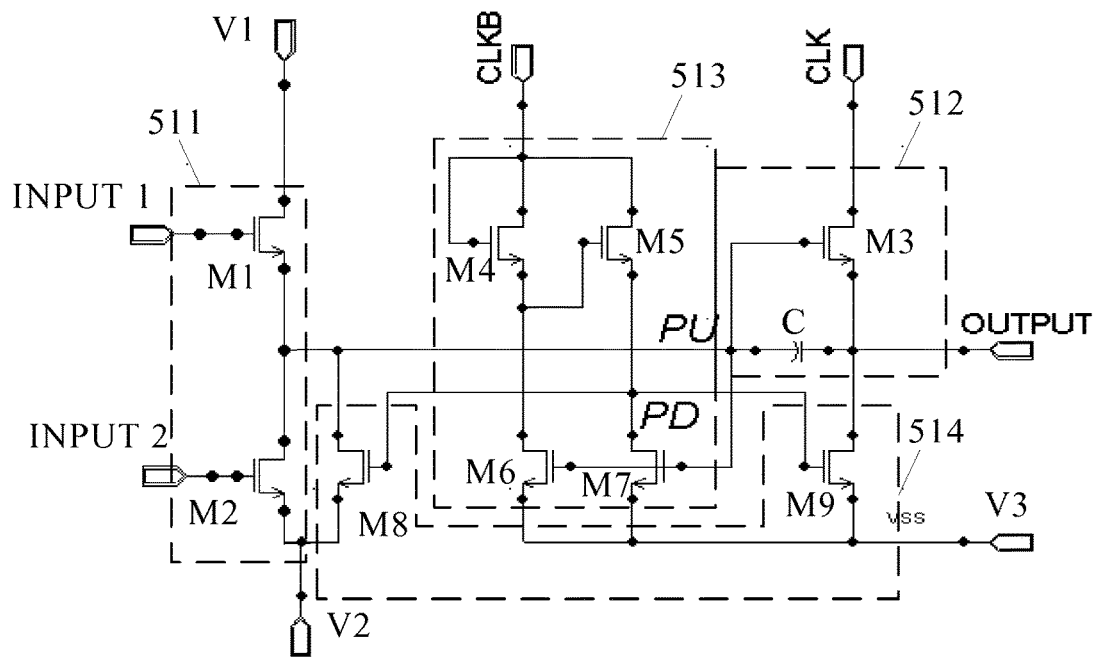
FIG. 7 is a schematic diagram of a circuit connection structure of a shift register unit according to an embodiment of the present disclosure.

In the circuit as shown in FIG. 6, the third voltage terminal V3 can be input a low level VSS signal. The clock signals input by both the first clock signal terminal CLK and the second clock signal terminal CLKB are square wave clock signals and have the same periods as well as duty ratio, but the two clock signals have opposite phases, that is, when CLK inputs the high level, CLKB inputs the low level FIG. 7 shows schematically a circuit connection structure of a shift register unit according to an embodiment of the present disclosure. As shown in FIG. 7, for example, the input resetting module 511 can comprise:

a first transistor M1, whose first electrode is connected to the pulling-up control node PU, gate is connected to the first signal input terminal INPUT1, and second electrode is connected to the first voltage terminal V1; and a second transistor M2, whose first electrode is connected to the second voltage terminal M2, gate is connected to the second signal input terminal INPUT2, and second electrode is connected to the pulling-up control node PU.

In the embodiment of the present disclosure, the pulling-up control node PU refers to a circuit node that controls the pulling-up module 512 to be in a turn-on or turn-off state. The function of the input resetting module 511 is to determine the high and low levels at the pulling-up control node PU according to different high and low levels input by the first signal input terminal INPUT1 and the second signal input terminal INPUT2, so as to determine whether the shift register unit is currently in an output or reset state.

The input resetting module 511 of such a structure can realize a gate drive unidirectional scanning from top to bottom. For example, when the output terminal OUTPUT of the previous stage of shift register unit outputs a signal, this output signal is input to the input terminal INPUT1 of the present stage of shift register unit, so as to pre-charge the node PU of the present stage until the next clock period comes to realize the output of the OUTPUT terminal of the present stage of shift register unit. The output signal of the present stage of shift register unit is simultaneously input to the INPUT2 terminal of the previous stage of shift register unit and the INPUT1 terminal of the next stage of shift register unit, so as to realize resetting the previous stage of shift register unit and pre-charging the node PU of the next stage of shift register unit, and so on and so forth, and finally realize the unidirectional scanning stage by stage from top to bottom. The shift register unit as shown in FIG. 7 is described by taking such an input resetting module 511 having the unidirectional scanning function as an example.

Alternatively, when the signals output from the previous stage and next stage of shift register units are used as the input signals of the first signal input terminal INPUT1 or the second signal input terminal INPUT2 of the present stage of shift register unit respectively, the input resetting module 511 of such a structure can further realize a bidirectional scanning of the gate driving circuit. For example, the first signal input terminal INPUT1 can be connected to the OUTPUT terminal of the previous stage of shift register terminal, and the second signal input terminal INPUT2 can be connected to the OUTPUT terminal of the next stage of shift register unit.

When the first voltage terminal V1 is input a high level and the second voltage terminal V2 is input a low level, the high level output from the previous stage of shift register unit can pre-charge the pulling-up module 512 through the input resetting module 511, and the high level output from the next stage of shift register unit can reset the pulling-module 512 through the input resetting module 511.

When the first voltage terminal V1 is input the low level and the second voltage terminal V2 is input the high level, the high level output by the next stage of shift register unit can pre-charge the pulling-up module 512 through the input resetting module 511, and the high level output from the previous stage of shift register unit can reset the pulling-up module 512 through the input resetting module 511.

It is noted that in the shift register unit as shown in FIG. 7, the signal input via the first voltage terminal V1 can be taken as the signal input via the first signal input terminal INPUT1. For example, in the process of realizing unidirectional scanning, the output signal of the previous stage of shift register unit can be simultaneously connected to the gate and second electrode of the transistor M1, so as to be able to input the high level while turning on the transistor M1.

Further, as shown in FIG. 7, the pulling-up module 512 can comprise:

a third transistor M3, whose first electrode is connected to the signal output terminal OUTPUT, gate is connected to the pulling-up control node PU, and second electrode is connected to the first clock signal input terminal CLK; and a capacitor C connected between the gate of the third transistor M3 and the first electrode of the third transistor M3 in parallel.

In the embodiment of the present disclosure, the pulling-up module 512 functions as making the output of the signal output terminal OUTPUT be a gate-driven high level signal, after pre-charging is performed and within the clock period during which the clock signal input via the first clock signal input terminal CLK is the high level.

Further, as shown in FIG. 7, the controlling module 513 can comprise:

a fourth transistor M4, whose gate and second electrode are both connected to the second clock signal input terminal CLKB;

a fifth transistor M5, whose gate is connected to a first electrode of the fourth transistor M4, and second electrode is connected to the second clock signal input terminal CLKB;

a sixth transistor M6, whose first electrode is connected to the third voltage terminal V3, gate is connected to the pulling-up control node PU, and second electrode is connected to the first electrode of the fourth transistor M4; and the seventh transistor M7, whose first electrode is connected to the third voltage terminal V3, gate is connected to the pulling-up control node PU, and second electrode is connected to the pulling-down control node PD.

In the embodiment of the present disclosure, the controlling module 513 functions as controlling the level at the pulling-down control node PD according to the voltage at the pulling-up control node PU. The pulling-down control node PD refers to a circuit node that controls the pulling-down module to be in a turn-on state or turn-off state.

Further, in the shift register unit as shown in FIG. 7, when the signal input via the first voltage terminal V1 is the signal input via the first signal input terminal INPUT1, the pulling-down module 514 can comprise:

an eighth transistor M8, whose first electrode is connected to the second voltage terminal V2, gate is connected to the pulling-down control node PD, and second electrode is connected to the pulling-up control node PU; and a ninth transistor M9, whose first electrode is connected to the third voltage terminal V3, gate is connected to the pulling-down control node PD, and second electrode is connected to the signal output terminal OUTPUT.

By adopting the pulling-down module 514 of such a structure, the circuit can be further simplified while the unidirectional scanning function of the shift register unit is realized, to make it convenient for design and manufacturing.

In the existing unidirectional scanning shift register unit, charges at the node PU are mainly leaked to the third voltage terminal V3 of the low level through the transistors M2 and M8 (it is the case of forward scanning, while the electricity in the case of the backward scanning is leaked through the transistors M1 and M8, and herein it is describe by taking the forward scanning as an example). In the case of performing the touch scanning, the phenomenon of electricity leakage exists for all of the above transistors. As shown in FIG. 7, in the unidirectional scanning shift register unit provided in the embodiments of the present disclosure, the transistors M2 and M8 are both connected to the second voltage terminal V2. In the case of performing the touch scanning, a signal BW input via the second voltage terminal V2 is set as the high level, so that Vbw>Vpu. According to the characteristics of the transistors, at this time, electricity leakage of the node PU through the transistors M2 and M8 will be changed into charging of the node PU through the transistors M2 and M8 by BW. Electricity leakage of the transistors M2 and M8 will be greatly reduced, so as to improve the electricity leakage of the node PU of the unidirectional scanning shift register unit.

Figure 8:
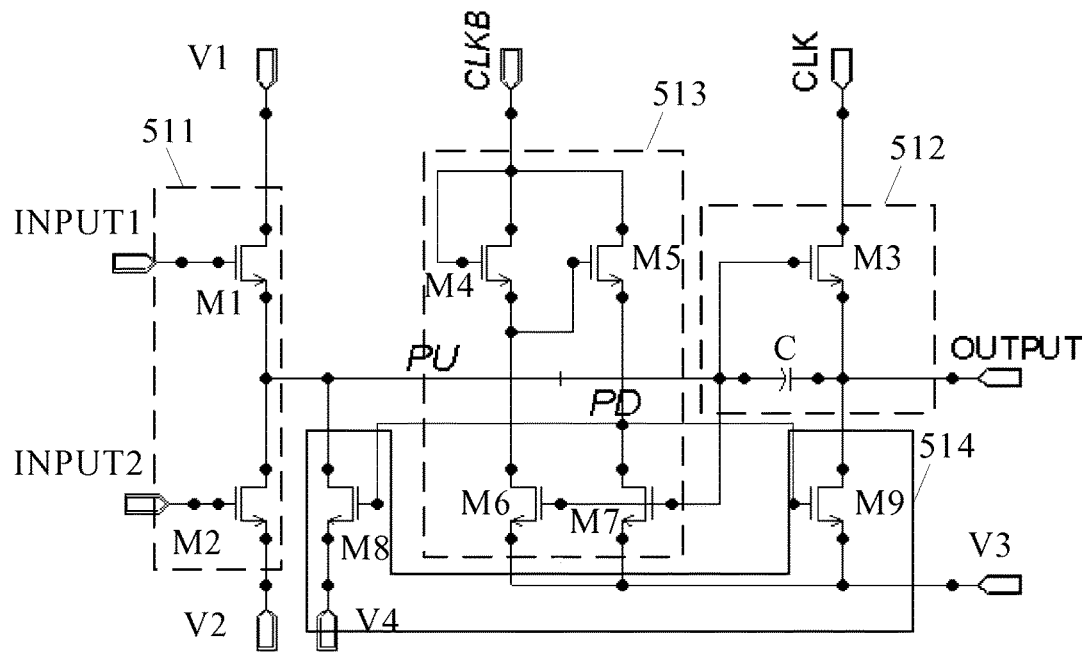
FIG. 8 is a schematic diagram of a circuit connection structure of another shift register unit according to an embodiment of the present disclosure.

FIG. 8 shows schematically a circuit connection structure of a shift register unit according to another embodiment of the present disclosure. Alternatively, in order to realize the function of bidirectional scanning, as shown in FIG. 8, unlike the structure of the shift register unit as shown in FIG. 7, the pulling-down module 514 can comprise:

the eighth transistor M8, whose first electrode is connected to the fourth voltage terminal V4, gate is connected to the pulling-down control node PD, and second electrode is connected to the pulling-up control node PU, the fourth voltage terminal V4 being input the low level; and the ninth transistor M9, whose first electrode is connected to the third voltage terminal V3, gate is connected to the pulling-down control node PD, and second electrode is connected to the signal output terminal OUTPUT.

In the existing shift register unit, charges at node PU are mainly leaked to the third voltage terminal V3 of the low level through the transistors M2 and M8 (it is the case of forward scanning, while the electricity in the case of the backward scanning is leaked through the transistors M1 and M8, and herein it is describe by taking the forward scanning as an example). When the node PU is at the high level, PD is very close to the low level VSS. Furthermore, due to the voltage dividing effect of the transistor M7, the voltage Vpd at the node PD will be slightly greater than VSS. Assuming that VSS is set as −10V, then the simulation result shows that Vpd is about −9.6V. For the transistor M8, the voltage Vpd at the gate will be slightly greater than the voltage VSS at the source. It can be known from the characteristics of the transistors that the transistors are closely turned on at this time, and thus the leakage current is very large.

Therefore, as shown in FIG. 8, an additional independent fourth voltage terminal V4 can be connected to the transistor M8 to input a direct current low level signal VSS1, which is set to be greater than Vpd. At the same time, in the case of performing the touch scanning, the signal BW input via the second voltage terminal V2 is set as the high level, so that Vbw>Vpu. According to the characteristics of the transistors, the electricity leakage of the node PU through the transistor M2 will be changed into charging of the node PU by the BW through the transistor M2. Thus, the electricity leakage of the transistor M8 will greatly be reduced, so as to improve the electricity leakage of the node PU of the bidirectional scanning shift register unit.

Figure 9:
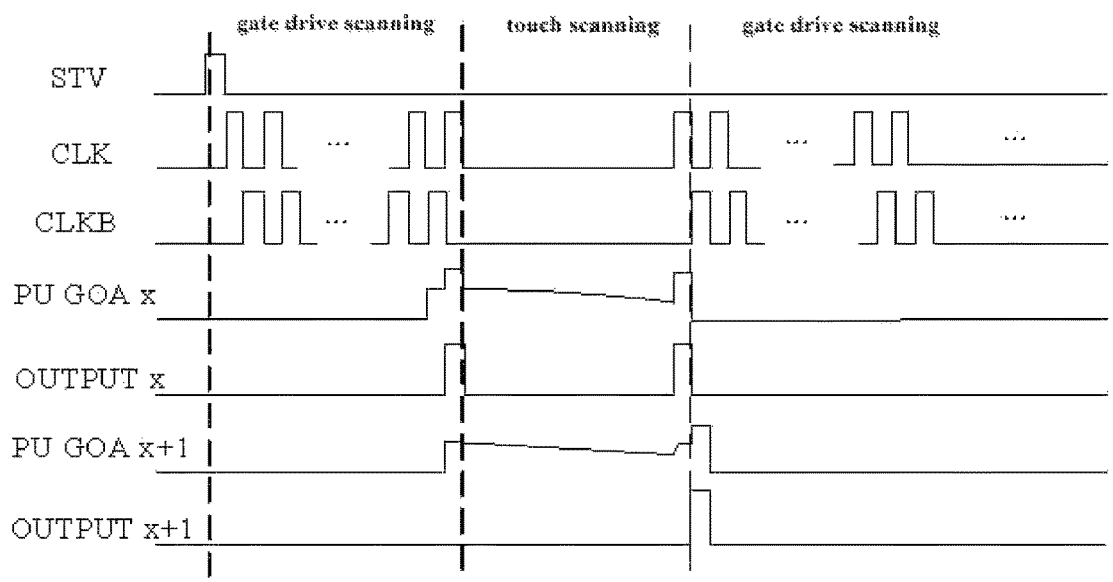
FIG. 9 is a timing schematic diagram of a driving signal of a shift register unit according to an embodiment of the present disclosure.

FIG. 9 schematically shows a timing of a driving signal of a shift register unit according to an embodiment of the present disclosure. For example, a timing signal as shown in FIG. 9 can be adopted to drive the above shift register unit. It can be seen from FIG. 9 that the situation of the electricity leakage of the node PU is effectively compensated. It can be known by measuring and calculating that the leakage current of the shift register unit with such a structure is reduced to 1/38~1/71 of the original. The improvement effect is apparent.

There are included in the shift register unit as shown in FIG. 7 or FIG. 8 respectively 9 transistors of N type and one capacitor (9 T1C). Compared with the prior art, the design of such circuit structure has relatively less elements and devices, thereby greatly simplifying the circuit design and reducing the difficulty in production, which effectively control the size of the circuit region and wiring space and realize the narrow frame design of the display apparatus.

In the embodiment of the present disclosure, when the gate drive scanning is performed in a top-to-bottom sequence, the first signal input terminal INPUT1 of the first stage shift register unit can be input a frame start signal STV as a start signal. After the scanning is completed, the second signal input terminal INPUT2 of the last stage of shift register unit can be input a resetting signal RST. The gate driving circuit as shown in FIG. 5 is described by taking the top-to-bottom scanning as an example.

Alternatively, when the gate drive scanning is performed in the bottom-to-top sequence, the second signal input terminal INPUT2 of the last stage of shift register unit can be input the frame start signal STV as the start signal. After the scanning is completed, the first signal input terminal INPUT1 of the first stage of shift register unit can be input the resetting signal RST, to which the present disclosure is not limit.

The gate driving circuit as shown in FIG. 5 is adopted to scan again the last stage of shift register unit located in the first region after the touch scanning is completed, so that the last stage of shift register unit located in the first region pre-charges the first stage of shift register unit located in the second region. In this way, it is avoided that the phenomenon of electricity leakage of a pulling-up control node PU of the first stage of shift register unit after the touch scanning is completed is caused by a relatively long touch scanning time intervened between outputs of the shift register units of two rows, thereby avoiding the defect of insufficient charging rate of pixels in rows while ensuring the touch scanning having a high report rate, greatly improving dark line or bad bright line and raising the display quality. Further, in the shift register unit as shown in FIG. 7 or 8, by inputting the high level into the second signal input terminal of the input resetting module in the case of performing the touch scanning, the level at the pulling-up control node is maintained, thereby further avoiding the phenomenon of the electricity leakage of the PU node and raising the quality of the display product.

In addition, an embodiment of the present disclosure further provides a display apparatus, comprising the gate driving circuit as described above.

Since the structure of the gate driving circuit has been described in detail in the above embodiments, no further description is repeated herein.

The display apparatus provided in the embodiment of the present disclosure comprises a gate driving circuit. The gate driving circuit scans successively respective stages of shift register units located in the first region and the second region, performs the touch scanning at intervals of the gate drive scanning in the two regions, and scans again the last stage of shift register unit located in the first region after the touch scanning is completed, so that the last stage of shift register unit located in the first region pre-charges the first stage of shift register unit located in the second region. In this way, it is avoided that the phenomenon of electricity leakage of a pulling-up control node PU of the first stage of shift register unit after the touch scanning is completed is caused by a relatively long touch scanning time intervened between outputs of the shift register units of two rows, thereby avoiding the defect of insufficient charging rate of pixels in rows while ensuring the touch scanning having a high report rate, greatly improving dark line or bad bright line and raising the display quality.

Those skilled in the art can understand that all or part of steps for implementing the above process embodiments can be completed by program instructions related hardware. The program can be stored in a computer readable storage medium. When the program is executed, the steps comprising the above process embodiments are performed; and the above storage medium comprises diversifies of media being capable of storing program codes such as ROM, RAM, disk or optical disk and the like.

The above descriptions are just particular implementations of the present disclosure, and the protection scope of the present disclosure is not limited thereto. Alternations or replacements that can be easily conceived by any one skilled who is familiar with the technical field within the technical scope disclosed in the present invention shall be covered within the protection scope of the present disclosure. Therefore, the protection scope of the present invention shall be subject to the protection of the claims.

The present application claims a priority of a Chinese patent application No. 201410119047.X filed on Mar. 27, 2014. Herein, the content disclosed by the Chinese patent application is incorporated herein in full as a part of the present disclosure.

What is claimed is:

1. A driving method of a gate driving circuit, the gate driving circuit comprising a plurality of shift register units connected mutually in cascade, the method comprising the following steps:

performing gate drive scanning on shift register units located in a first region in the gate driving circuit during a first time period of one frame time for display scanning;

performing touch scanning during a second time period of one frame time for display scanning after the gate drive scanning of the shift register units in the first region during the first time period is completed;

before the touch scanning during the second time period is completed, scanning again a last stage of the shift register units located in the first region for outputting again a gate driving signal before the end of the second time period, so that the last stage of the shift register units located in the first region pre-charges a first stage of shift register units located in a second region; and performing gate drive scanning on shift register units located in the second region in the gate driving circuit during a third time period of one frame time for display scanning, the last stage of the shift register unit located in the first region being connected in cascade with the first stage of the shift register units located in the second region.

2. A gate driving circuit comprising a plurality of shift register units mutually connected in cascade, wherein except for a first stage of the shift register units, a signal output terminal of each remaining stage of the shift register units is connected to a second signal input terminal of its adjacent previous stage of the shift register units;

except for a last stage of the shift register units, a signal output terminal of each remaining stage of the shift register units is connected to a first signal input terminal of its adjacent next stage of the shift register units;

scan outputting and touch scanning of multiple stages of the shift register units in the gate driving circuit are performed at intervals;

each stage of shift register units located in a first region in the gate driving circuit outputs a gate driving signal during a first time period of one frame time for display scanning;

touch scanning for the multiple stages of the shift register units in the gate driving circuit is performed during a second time period of one frame time for display scanning after the shift register units in the first region output gate driving signals during the first time period;

each stage of shift register units located in a second region in the gate driving circuit outputs a gate driving signal during a third time period of one frame time for display scanning;

before the touch scanning during the second time period is completed, a last stage of the shift register units located in the first region outputs a gate driving signal again before the end of the second time period, so that the last stage of the shift register units located in the first region pre-charges a first stage of the shift register units located in the second region; and the last stage of the shift register units located in the first region is connected in cascade with the first stage of the shift register units located in the second region.

3. The gate driving circuit according to claim 2, wherein the shift register unit comprises:

an input resetting module connected to the first signal input terminal, a second signal input terminal, a first voltage terminal, a second voltage terminal, and a pulling-up control node, and configured to control a level at the pulling-up control node according to signals input via the first signal input terminal and the second signal input terminal, wherein a high level is input via the second signal input terminal in a case of performing the touch scanning to keep the level at the pulling-up control node;

a pulling-up module connected to a first clock signal input terminal, the pulling-up control node and the signal output terminal, and configured to pull up a signal output by the signal output terminal to a high level according to the level at the pulling-up control node and a clock signal input by the first clock signal input terminal, the pulling-up control node being a connecting point of the input resetting module and the pulling-up module;

a controlling module connected to a second clock signal input terminal, a third voltage terminal, the pulling-up control node, and a pulling-down control node, and configured to control a level at the pulling-down control node according to a clock signal input by the second clock signal input terminal and the level at the pulling-up control node; and a pulling-down module connected to the pulling-up control node, the pulling-down control node, the third voltage terminal, a fourth voltage terminal, and the signal output terminal, and configured to pull down the signal output by the signal output terminal to a low level.

4. The gate driving circuit according to claim 3, wherein the input resetting module comprises:

a first transistor, whose first electrode is connected to the pulling-up control node, gate is connected to the first signal input terminal, and second electrode is connected to the first voltage terminal; and a second transistor, whose first electrode is connected to the second voltage terminal, gate is connected to the second signal input terminal, and second electrode is connected to the pulling-up control node.

5. The gate driving circuit according to claim 4, wherein a signal input via the first voltage terminal is a signal input via the first signal input terminal.

6. The gate driving circuit according to claim 4, wherein the pulling-up module comprises:

a third transistor, whose first electrode is connected to the signal output terminal, gate is connected to the pulling-up control node, and second electrode is connected to the first clock signal input terminal; and a capacitor connected in parallel between the gate of the third transistor and the first electrode of the third transistor.

7. The gate driving circuit according to claim 6, wherein the controlling module comprises:

a fourth transistor, whose gate and second electrode are both connected to the second clock signal input terminal;

a fifth transistor, whose gate is connected to a first electrode of the fourth transistor, and second electrode is connected to the second clock signal input terminal;

a sixth transistor, whose first electrode is connected to the third voltage terminal, gate is connected to the pulling-up control node, and second electrode is connected to the first electrode of the fourth transistor; and a seventh transistor, whose first electrode is connected to the third voltage terminal, gate is connected to the pulling-up control node, and second electrode is connected to the pulling-down control node.

8. The gate driving circuit according to claim 7, wherein when the signal input via the first voltage terminal is the signal input via the first signal input terminal, the pulling-down module comprises:

an eighth transistor, whose first electrode is connected to the fourth voltage terminal, gate is connected to the pulling-down control node, and second electrode is connected to the pulling-up control node, the fourth voltage terminal and the second voltage terminal being input a same voltage; and a ninth transistor, whose first electrode is connected to the third voltage terminal, gate is connected to the pulling-down control node, and second electrode is connected to the signal output terminal.

9. The gate driving circuit according to claim 7, wherein the pulling-down module comprises:

an eighth transistor, whose first electrode is connected to the fourth voltage terminal, gate is connected to the pulling-down control node, and second electrode is connected to the pulling-up control node, the fourth voltage terminal being input a low voltage; and a ninth transistor, whose first electrode is connected to the third voltage terminal, gate is connected to the pulling-down control node, and second electrode is connected to the signal output terminal.

10. The gate driving circuit according to claim 2, wherein the first signal input terminal of the first stage of the shift register units is input a frame start signal, and the second signal input terminal of the last stage of the shift register units is input a resetting signal; or the second signal input terminal of the last stage of the shift register units is input a frame start signal, and the first signal input terminal of the first stage of the shift register units is input a resetting signal.

11. A display apparatus comprising the gate driving circuit according to claim 2.

12. The display apparatus according to claim 11, wherein the shift register unit comprises:

an input resetting module connected to the first signal input terminal, a second signal input terminal, a first voltage terminal, a second voltage terminal, and a pulling-up control node, and configured to control a level at the pulling-up control node according to signals input via the first signal input terminal and the second signal input terminal, wherein a high level is input via the second signal input terminal in a case of performing the touch scanning to keep the level at the pulling-up control node;

a pulling-up module connected to a first clock signal input terminal, the pulling-up control node and the signal output terminal, and configured to pull up a signal output by the signal output terminal to a high level according to the level at the pulling-up control node and a clock signal input by the first clock signal input terminal, the pulling-up control node being a connecting point of the input resetting module and the pulling-up module;

a controlling module connected to a second clock signal input terminal, a third voltage terminal, the pulling-up control node, and a pulling-down control node, and configured to control a level at the pulling-down control node according to a clock signal input by the second clock signal input terminal and the level at the pulling-up control node; and a pulling-down module connected to the pulling-up control node, the pulling-down control node, the third voltage terminal, a fourth voltage terminal, and the signal output terminal, and configured to pull down the signal output by the signal output terminal to a low level.

13. The display apparatus according to claim 12, wherein the input resetting module comprises:
   a first transistor, whose first electrode is connected to the pulling-up control node, gate is connected to the first signal input terminal, and second electrode is connected to the first voltage terminal; and
   a second transistor, whose first electrode is connected to the second voltage terminal, gate is connected to the second signal input terminal, and second electrode is connected to the pulling-up control node.

14. The display apparatus according to claim 13, wherein a signal input via the first voltage terminal is a signal input via the first signal input terminal.

15. The display apparatus according to claim 13, wherein the pulling-up module comprises:
   a third transistor, whose first electrode is connected to the signal output terminal, gate is connected to the pulling-up control node, and second electrode is connected to the first clock signal input terminal; and
   a capacitor connected in parallel between the gate of the third transistor and the first electrode of the third transistor.

16. The display apparatus according to claim 15, wherein the controlling module comprises:
   a fourth transistor, whose gate and second electrode are both connected to the second clock signal input terminal;
   a fifth transistor, whose gate is connected to a first electrode of the fourth transistor, and second electrode is connected to the second clock signal input terminal;
   a sixth transistor, whose first electrode is connected to the third voltage terminal, gate is connected to the pulling-up control node, and second electrode is connected to the first electrode of the fourth transistor; and
   a seventh transistor, whose first electrode is connected to the third voltage terminal, gate is connected to the pulling-up control node, and second electrode is connected to the pulling-down control node.

17. The display apparatus according to claim 16, wherein when the signal input via the first voltage terminal is the signal input via the first signal input terminal, the pulling-down module comprises:
   an eighth transistor, whose first electrode is connected to the fourth voltage terminal, gate is connected to the pulling-down control node, and second electrode is connected to the pulling-up control node, the fourth voltage terminal and the second voltage terminal being input a same voltage; and
   a ninth transistor, whose first electrode is connected to the third voltage terminal, gate is connected to the pulling-down control node, and second electrode is connected to the signal output terminal.

18. The display apparatus according to claim 16, wherein the pulling-down module comprises:
   an eighth transistor, whose first electrode is connected to the fourth voltage terminal, gate is connected to the pulling-down control node, and second electrode is connected to the pulling-up control node, the fourth voltage terminal being input a low voltage; and
   a ninth transistor, whose first electrode is connected to the third voltage terminal, gate is connected to the pulling-down control node, and second electrode is connected to the signal output terminal.

19. The display apparatus according to claim 11, wherein the first signal input terminal of the first stage of the shift register units is input a frame start signal, and the second signal input terminal of the last stage of the shift register units is input a resetting signal; or
   the second signal input terminal of the last stage of the shift register units is input a frame start signal, and the first signal input terminal of the first stage of the shift register units is input a resetting signal.

* * * * *